(12) United States Patent
Sousa et al.

(10) Patent No.: US 6,728,274 B1
(45) Date of Patent: Apr. 27, 2004

(54) MULTI-WAVELENGTH LASER APPARATUS AND METHOD

(75) Inventors: João M. Sousa, Valongo (PT); Francisco M. Araújo, Oporto (PT); Paulo T. Guerreiro, Estoril (PT); Luis A. Ferreira, Vila Nova de Gaia (PT); Antonio Lobo Ribeiro, Maia (PT); José R. Salcedo, Oporto (PT)

(73) Assignee: Multiwave Networks Portugal Lda, Moreira da Maia (PT)

( * ) Notice: Subject to any disclaimer, the term of this patent is extended or adjusted under 35 U.S.C. 154(b) by 91 days.

(21) Appl. No.: 09/951,554

(22) Filed: Sep. 14, 2001

(51) Int. Cl.$^7$ .................................................. H01S 3/10
(52) U.S. Cl. .......................... 372/20; 372/94; 372/98; 372/23; 372/27; 372/102; 372/6
(58) Field of Search ............................. 372/20, 94, 98, 372/27, 6, 23, 102; 385/27

(56) References Cited

U.S. PATENT DOCUMENTS

| | | | |
|---|---|---|---|
| 4,680,767 A | | 7/1987 | Hakimi et al. |
| 5,191,586 A | | 3/1993 | Huber |
| 5,440,417 A | | 8/1995 | Chung et al. |
| 5,524,118 A | | 6/1996 | Kim et al. |
| 5,666,372 A | | 9/1997 | Ball et al. |
| 5,910,962 A | | 6/1999 | Pan et al. |
| 6,041,070 A | * | 3/2000 | Koch et al. ................... 372/6 |
| 6,061,369 A | * | 5/2000 | Conradi |
| 6,067,391 A | * | 5/2000 | Land ........................... 385/27 |
| 6,091,744 A | * | 7/2000 | Sorin et al. ................. 372/20 |
| 6,148,011 A | | 11/2000 | Larose et al. |
| 6,163,553 A | | 12/2000 | Pfeiffer |

* cited by examiner

Primary Examiner—Leon Scott, Jr.
(74) Attorney, Agent, or Firm—Hunton & Williams LLP

(57) ABSTRACT

A fiber-optic laser source capable of emitting multiple useful wavelengths at the same time, including multiple ITU grid wavelengths, is disclosed. The laser preferably comprises a diode-pumped rare-earth doped fiber amplifier as gain medium, a periodic filter to define a first set of possible lasing wavelengths corresponding to ITU grid lasing wavelengths, and a resonant filter for defining a subset of the first set of wavelengths. The arrangement is enclosed in a ring resonator. The ring resonator may be made, in part or in total, with polarization-maintaining optical fiber. The resonator may also comprise in-line optical isolators to ensure unidirectional operation and to eliminate undesired reflections. A gain-flattening filter may also be included within the resonator depending on the desired output characteristics of the laser. The laser may be designed to operate in a set of single cavity longitudinal modes. The disclosed laser may also comprise output wavelength and/or power definition and stabilization control.

74 Claims, 12 Drawing Sheets

MULTI-WAVELENGTH LASER APPARATUS AND METHOD

TECHNICAL FIELD OF THE INVENTION

This invention relates to lasers and, more specifically, to multi-wavelength lasers such as may be suitable for dense wavelength division multiplexed (DWDM) applications. It also pertains to methods by which such lasers operate.

BACKGROUND OF THE INVENTION

Wavelength division multiplexing, or WDM, is a known method for increasing the capacity of a fiber optic communication system. WDM increases capacity by permitting a single optical fiber to carry multiple optical carrier signals having differing wavelengths. After transmission, at the receiving end, the multiple wavelengths are demultiplexed to separate the signals.

The concepts behind WDM have been extended to use a set of closely-spaced wavelengths in the 1550 nm window. The International Telecommunication Union (ITU) has proposed the use of a grouping or grid of wavelengths in this window. As presently configured, the channels are anchored to a reference at 193.10 THz and equally spaced in frequency, the closely spaced grids having channels 100 GHz or 50 GHz apart. In the wavelength range between 1528.77 nm and 1560.61 nm, the ITU 100 GHz grid comprises 41 channels. This method of WDM is known as dense wavelength division multiplexing, or DWDM.

Communication systems to implement this scheme thus must have access to emissions at each of the grid wavelengths. This could be accomplished by having a multitude of different laser sources, each having an emission wavelength corresponding to a respective one of the grid wavelengths. It would be far more convenient, cost-effective and efficient, however, to have the capability of producing different wavelengths without having to increase correspondingly the number of different laser sources. A single laser source capable of having multiple emission wavelengths at ITU grid wavelengths is therefore desirable. This type of laser source would also prove advantageous in sparing and hot sparing configurations for DWDM, and would allow for reconfigurable DWDM optical communication networks and network elements. Such an apparatus should be capable of producing signals across the widest possible wavelength range, and provide consistent optical output power across its entire wavelength operating range.

SUMMARY OF THE INVENTION

These and other ends are met in the present invention through provision of a laser apparatus comprising a gain module which is pumped by applied pump radiation, the pump radiation exciting the gain module and thereby achieving lasing action. The laser apparatus also has a control module, with the control module including a periodic filter arranged to receive optical energy from the gain module and having relatively higher transmissivity in certain predefined frequency bandwidths to define a first set of frequency passbands, and a resonant filter arranged to receive optical energy from the periodic filter and defining a second set of frequency passbands, the second set of frequency passbands being a subset of the first set of frequency passbands.

The laser apparatus is preferably configured as a ring laser resonator.

The control module may further comprise an optical circulator with the periodic filter and the resonant filter being coupled using the optical circulator. The first set of frequency passbands may correspond to International Telecommunication Union frequency grid recommendations.

The periodic filter may be a transmission filter or a reflection filter. If it is a transmission filter, it may be any one of a number of specific types of transmission filters including a fiber Fabry-Pérot micro-etalon transmission filter or a fiber-coupled Fabry-Pérot micro-etalon transmission filter. If it is a reflection filter, it may be any one of a number of specific types of reflection filters including a sampled fiber Bragg grating or a set of sampled fiber Bragg gratings. The periodic filter may also be tunable.

The laser apparatus may also include means for ensuring unidirectional laser oscillation, which may be an optical isolator, and an optical gain-flattening filter for obtaining an approximately constant laser output power for specified wavelengths of operation of the laser resonator. The optical gain-flattening filter may have a wavelength-dependent loss curve which compensates the wavelength-dependent gain curve of the gain module and may be made up of a set of long-period fiber gratings. It is also possible that the optical gain-flattening filter may be incorporated into the gain module. The laser apparatus may also include at least one polarization controller.

The periodic filter may have passbands spaced apart at a frequency spacing of 200 GHz or a sub-multiple of 200 GHz. The center frequency of at least one passband of the first set of frequency passbands may be maintained referenced to a predetermined frequency so as to obtain a laser output with wavelengths according to the International Telecommunication Union frequency grid recommendations. The resonant filter then has a subset of frequency passbands selected from the set of frequency passbands defined by the periodic filter. The resonant filter passband bandwidths may be sufficiently narrow that within each resonant filter passband laser oscillation occurs at wavelengths within a single passband of the passbands of the periodic filter. In another embodiment, each of one or more of the resonant filter passbands may enclose more than one of the passbands of the periodic filter, allowing multiple-wavelength laser oscillation with wavelengths within adjacent passbands of the periodic filter.

The control module may also include an optical isolator, and may further include a wavelength reference control module for locking a spectral response of the periodic filter to the first set of passbands. The wavelength reference control module may include a coupler, optically coupled to the other elements in the resonator, for extracting a small fraction of laser radiation from the laser cavity, a photodetector, and a wavelength reference filter for coupling a narrow-band optical signal from the coupler to the photodetector to provide a stable wavelength reference. The wavelength reference filter may be a reflective wavelength reference filter, and, if it is, it may be made up of a temperature-compensated fiber Bragg grating.

The control module may further include a spectral selective transmission module which may be made up of a set of fiber-fused Mach-Zehnder interleavers.

At least one of the periodic filter and the resonant filter may be only partially reflective to provide a means for extracting optical output energy without the use of a separate output coupler. Also, at least one of the resonant filter and the periodic filter may include means for accessing individual oscillation wavelengths of the laser. The means for accessing individual oscillation wavelengths of laser may be separated output optical fibers. A separate laser output power control module may be inserted in-line with each of the output optical fibers. The means for accessing individual oscillation wavelengths of laser may also be made up of a spectral selective transmission module and a set of filters. The spectral selective transmission module may be comprised of a set of fiber-fused Mach-Zehnder interleavers and the set of filters may be comprised of a set of fiber Bragg gratings.

At least one of the periodic filter and resonat filter may have a wavelength-dependent envelope curve, which compensates a wavelength-dependent gain curve of the gain module.

The laser apparatus may also include a laser output power control module, inserted in-line with an output of the laser, for setting and maintaining a predetermined level for optical output power of the lasers. The laser output power control module may be made up of a coupler to extract a fraction of laser optical output power, a calibrated photodetector optically coupled to the coupler and producing an electric reference signal, a loop control unit, arranged to receive the electric reference signal, for generating an control signal based on the electric reference signal, and an in-line variable optical attenuator arranged to receive the control signal, for controlling the laser optical output power based on the control signal.

The invention also resides in a method of generating a multiple wavelength laser output at several of a set of discrete frequencies, the method comprising the steps of providing pump energy to a gain medium in a laser cavity to excite laser resonances, filtering the laser resonances using a periodic filter to limit possible lasing frequencies to the frequencies in the set; and filtering the laser resonances using a resonant filter to limit possible lasing frequencies to a subset of the frequencies in the set.

DETAILED DESCRIPTION OF PREFERRED EMBODIMENTS

Figure 1:
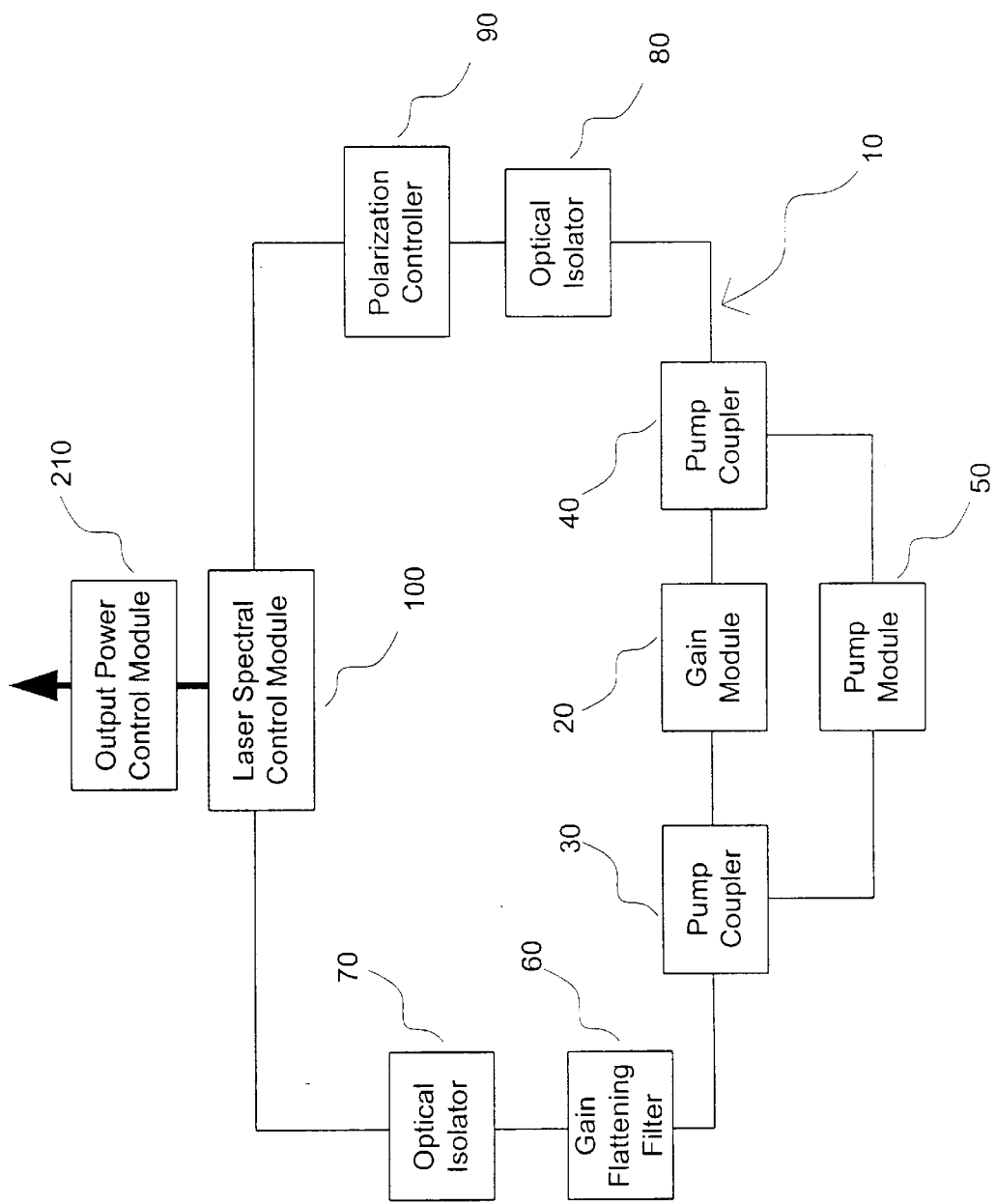
FIG. 1 is a functional block diagram of a presently preferred embodiment of a multi-wavelength laser according to the present invention.

FIG.1 is a functional block diagram of a presently preferred configuration for a laser according to the invention. As can be seen in FIG. 1, it is presently preferred to embody the invention as a multi-wavelength fiber-optic ring laser 10. The configuration of FIG.1 preferably includes several cavity elements, as described below. While for the sake of illustration a specific ordering of elements is shown for the ring configuration described immediately below, it will be readily apparent to one having ordinary skill in the art that cavity elements may be placed within the cavity in relative positions other than those shown and described. Also, while the presently preferred embodiment is as a ring laser, it will be apparent to one of ordinary skill in the art that a linear arrangement of elements could be used as well.

A presently preferred embodiment, as depicted in FIG. 1, includes a laser spectral control module 100. It is presently preferred that this laser spectral control module 100 includes means to define and stabilize the multi-wavelength output spectrum of laser 10 and means to provide a useful output from the fiber laser 10, as described. It is also presently preferred to use the laser spectral control module 100 in conjunction with means for defining and stabilizing the output power of laser 10, also as described below.

The laser spectral control module 100 is optically coupled to a gain module 20. Here and elsewhere, "optically coupled" means arranged so that optical radiation may pass from one to the other or vice versa, and possibly passing through one or more active or passive intermediate optical elements along the way. Also, in the figures it will be understood that the solid lines interconnecting the components are intended to depict optical paths, and that thicker solid lines interconnecting the components are intended to depict one or more optical paths. In the presented preferred embodiments the optical interconnecting path is defined with optical fiber. Also, in the figures it will be understood that the dashed lines interconnecting the components are intended to depict electrical connections.

It is presently preferred that the gain module 20 be made up of a length of rare earth doped optical fiber. More preferably, in a preferred embodiment the gain module 20 includes a length of erbium-doped optical fiber. It will, however, be apparent to one of ordinary skill in the art that other rare earth and transition metal materials may be used as dopants or co-dopants of the optical fiber in the gain module 20, in concentrations which may be varied across the radial and/or longitudinal profile of the fiber. It will also be apparent to one of ordinary skill in the art that gain module 20 may be made up of other optical amplifiers, such as: fiber Raman amplifier, semiconductor optical amplifier, rare-earth doped waveguide amplifier or doped solid-state amplifier. Also, supplementary gain modules can be added to the laser 10 in series or parallel with the gain module 20 in order to extend the tuning range and/or to increase the optical output power of the laser 10.

Pump couplers 30 and 40 are used to couple the output of a pump module 50 into the fiber laser 10. It is presently preferred that the couplers 30 and 40 be fiber-fused wavelength division multiplexer couplers which couple the optical radiation from the pump module 50 into the laser 10. However, coupling the pump laser light radiation into the ring laser 10 is not limited to this method and may be achieved by any of several other methods known in the art. The pump module 50 may be any one of many commonly available pump laser sources, including an array of pump laser diodes arranged according to a pump redundancy scheme. In the presented preferred embodiment the pump module 50 is constituted by two laser diodes providing both co-propagating and contra-propagating pump radiation into the gain module 20.

The arrangement of FIG.1 may also include an optical gain-flattening filter 60 arranged within the laser resonator with the purpose of obtaining an approximately constant laser output power for all the specified wavelengths of operation of the laser 10. The optical gain-flattening filter 60 has a wavelength-dependent loss curve which compensates the wavelength-dependent gain curve of the gain module 20, in the sense that the effect of the loss curve of the gain-flattening filter 60 when combined with the effect of the gain curve of the gain module 20 results in an approximately flat overall gain curve for the operation wavelength range of the laser 10. In a presently preferred embodiment the gain-flattening filter 60 may include a set of long-period fiber gratings with a compensating loss curve, in the sense just described. Also, the gain-flattening filter 60 can be inserted into the gain module 20. In a preferred embodiment the position of the gain-flattening filter 60 within the gain module 20 is such that it ensures minimum excess insertion loss.

In the presently preferred embodiment depicted in FIG. 1, the laser 10 includes optical isolators 70 and 80 to ensure unidirectional laser oscillation and to prevent unwanted reflections induced by elements inside the cavity from adversely affecting the operation of the multi-wavelength fiber-optic ring laser 10. It will, however, be apparent to one of ordinary skill in the art that, in certain applications, the position and/or number of optical isolators may be changed to obtain enhanced performance of the laser 10. It is also possible that a design for the gain module 20 may already include one or two optical isolators, which may render some of the shown optical isolators unnecessary.

A polarization controller 90, which may include a polarizer, can be used within the laser 10 in order to optimize the laser operation whenever polarization-dependent elements are used within the laser cavity and/or, for certain applications, to define a specific state-of-polarization for the output radiation of the laser 10.

Figure 2:
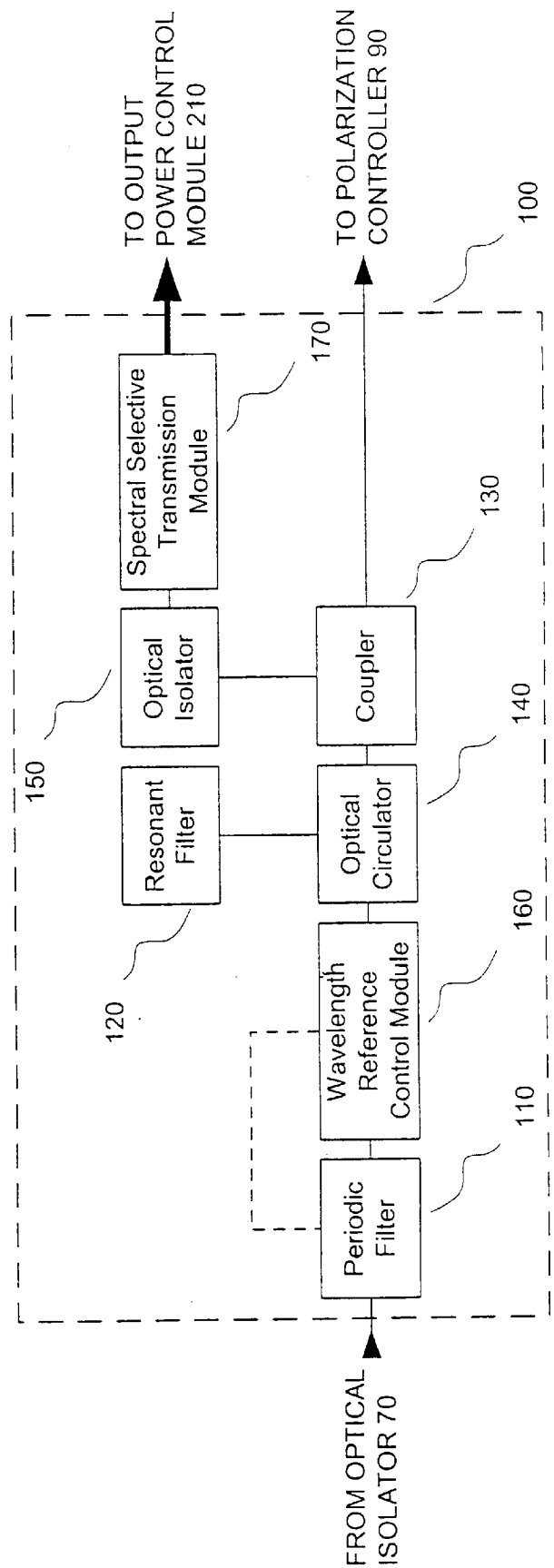
FIG. 2 is a functional block diagram of a first presently preferred embodiment of a laser spectral control module according to the present invention.

As shown in FIG. 2, a first presently preferred embodiment of the laser spectral control module 100 includes a periodic filter 110 optically coupled to a resonant filter 120 and optically coupled to an output coupler 130 through a three port optical circulator 140, as depicted in FIG. 2. The periodic filter 10 is a filter that has high transmissivity for light with frequency within certain frequency bands, i.e., passbands, at approximately constant frequency spacing. In the preferred embodiment, the periodic filter 110 has passbands spaced apart at a frequency spacing of 200 GHz or a sub-multiple of that spacing, such as 100 GHz, 50 GHz, 25 GHz, 12.5 GHz, or other. The periodic filter 110 limits the possible lasing wavelengths of the multi-wavelength ring laser 10 by introducing lower optical loss at the passbands as compared to other wavelengths, with the effect of precluding laser action at the low transmissivity bands. In the preferred embodiment, the center wavelength of one, or more, of the passbands may be kept at or near certain predetermined frequency values so as to obtain a laser output with a wavelength or wavelengths according to International Telecommunication Union (ITU) frequency grid recommendations, or according to another set of wavelengths. For certain applications the periodic filter 110 may be tunable by electrical or mechanical means.

The resonant filter 120 is preferably an optical filter with a subset of arbitrary frequency passbands selected from the set of frequency passbands defined by the periodic filter 110. In the presently preferred embodiment of the invention it is preferred to use a resonant filter with passband bandwidths, which are small enough, that within each resonant filter passband laser oscillation occurs only for wavelengths within a single of the pre-selected passbands of the periodic filter 110. It will be readily apparent to one having ordinary skill in the art that the passband bandwidth of the resonant filter 120 may enclose more than one of the passbands of the periodic filter 110, thus allowing multiple wavelength laser oscillation with wavelengths within adjacent passbands of the periodic filter 110.

The output coupler 130 is preferably a fiber-fused coupler. The output coupler 130 is used to provide a useful output from the ring fiber laser 10. The coupler 130 is provided in line in the resonator so that a portion of the optical energy entering the coupler 130 is coupled out of the resonator as an output, towards the power control module 210. Another portion of the optical energy entering the coupler 130, however, passes through the coupler 130 and stays in the resonator 10. In the presently preferred embodiment, the coupling ratio of the output coupler 130 is such that it maximizes the optical output power. As an illustrative example, the output coupler 130 may be a 10/90 fiber-fused coupler.

The first presently preferred embodiment of the laser spectral control module 100 as depicted in FIG. 2 also includes an optical isolator 150 to prevent unwanted reflections induced by elements outside the cavity from adversely affecting the operation of the multi-wavelength fiber-optic ring laser 10.

Figure 3:
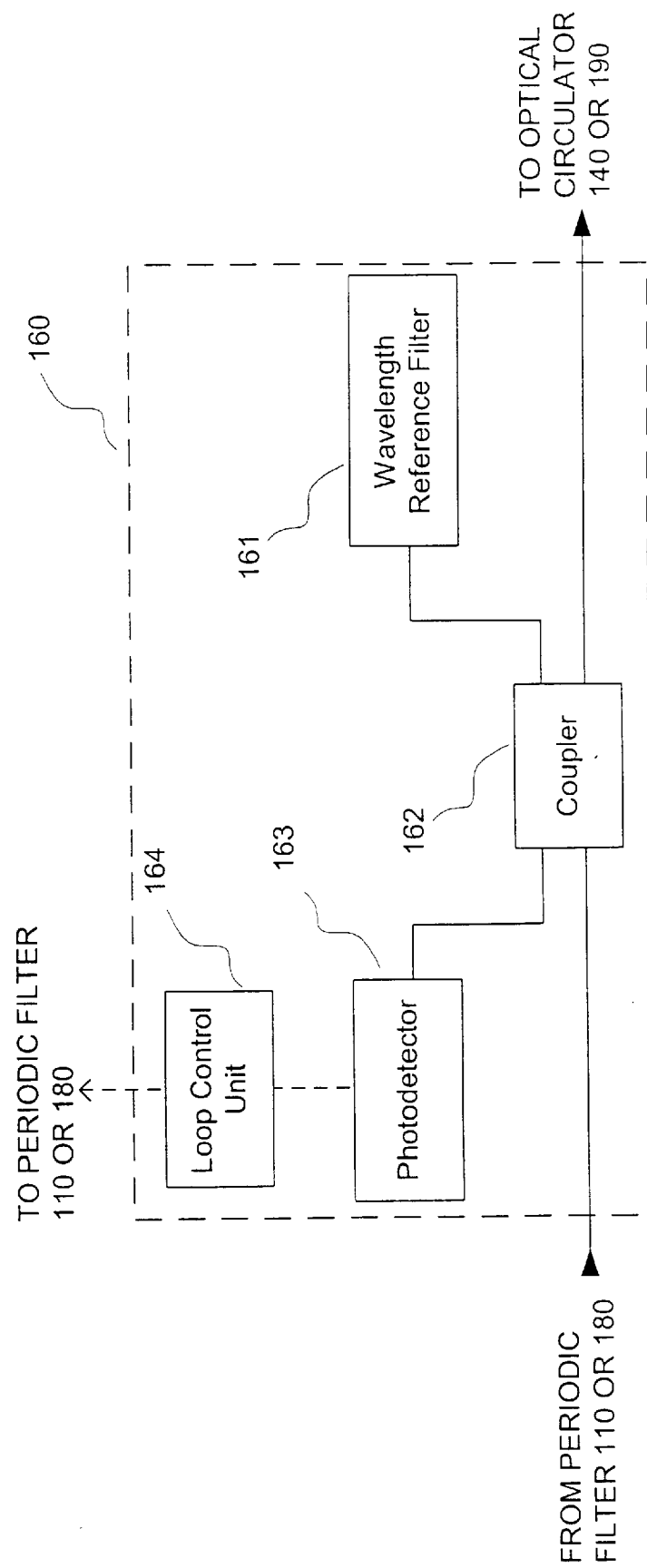
FIG. 3 is a functional block diagram of a presently preferred embodiment of a wavelength reference control module according to the present invention.

As depicted in FIG. 2, the laser spectral control module 100 may also include a wavelength reference control module 160 in order to lock the spectral response of the periodic filter 110 to the ITU grid. In the presently preferred embodiment of the invention, the wavelength reference control module 160 includes, as shown in FIG. 3, a wavelength reference filter 161, a coupler 162 and a photodetector 163. The coupler 162 is inserted in-line with the ring cavity laser 10, optically coupled to the other elements in the resonator, with the purpose of extracting a small fraction of the laser radiation from the laser cavity. As an illustrative example, the coupler 162 may be a 01/99 fiber-fused coupler. However, extracting a fraction of the laser light radiation is not limited to this method and may be achieved by any of other methods known in the art. The narrow-band optical signal coupled by the wavelength reference filter 161 to the detector 163 provides a stable wavelength reference suitable for closed-loop operation. In the closed-loop mode of operation long-term wavelength drift, caused by thermal and/or mechanical-induced fluctuations, in the periodic filter spectral response is prevented by the loop control unit 164.

FIG. 3 illustrates a configuration using a reflective wavelength reference filter 161. As an illustrative example, the wavelength reference filter 161 may be a temperature-compensated fiber Bragg grating. It will, however, be apparent to one of ordinary skill in the art that stabilized wavelength reference filters other than this one may also be used, such as transmission notch filters.

Certain applications make it necessary or desirable to access the individual oscillation wavelengths of laser 10 through different optical fibers. In a presently preferred embodiment of the invention, this is achieved by inserting, in the laser spectral control module 100, a spectral selective transmission module 170 optically coupled to the optical isolator 150, as depicted in FIG. 2. As mentioned, the thicker solid line represents one or more optical fibers. As an illustrative example, the spectral selective transmission module 170 may be a set of fiber-fused Mach-Zehnder interleavers. However, means for accessing the individual oscillation wavelengths of laser 10 through separate output optical fibers is not limited to this device and may be achieved by any of other means or methods known in the art.

Figure 4:
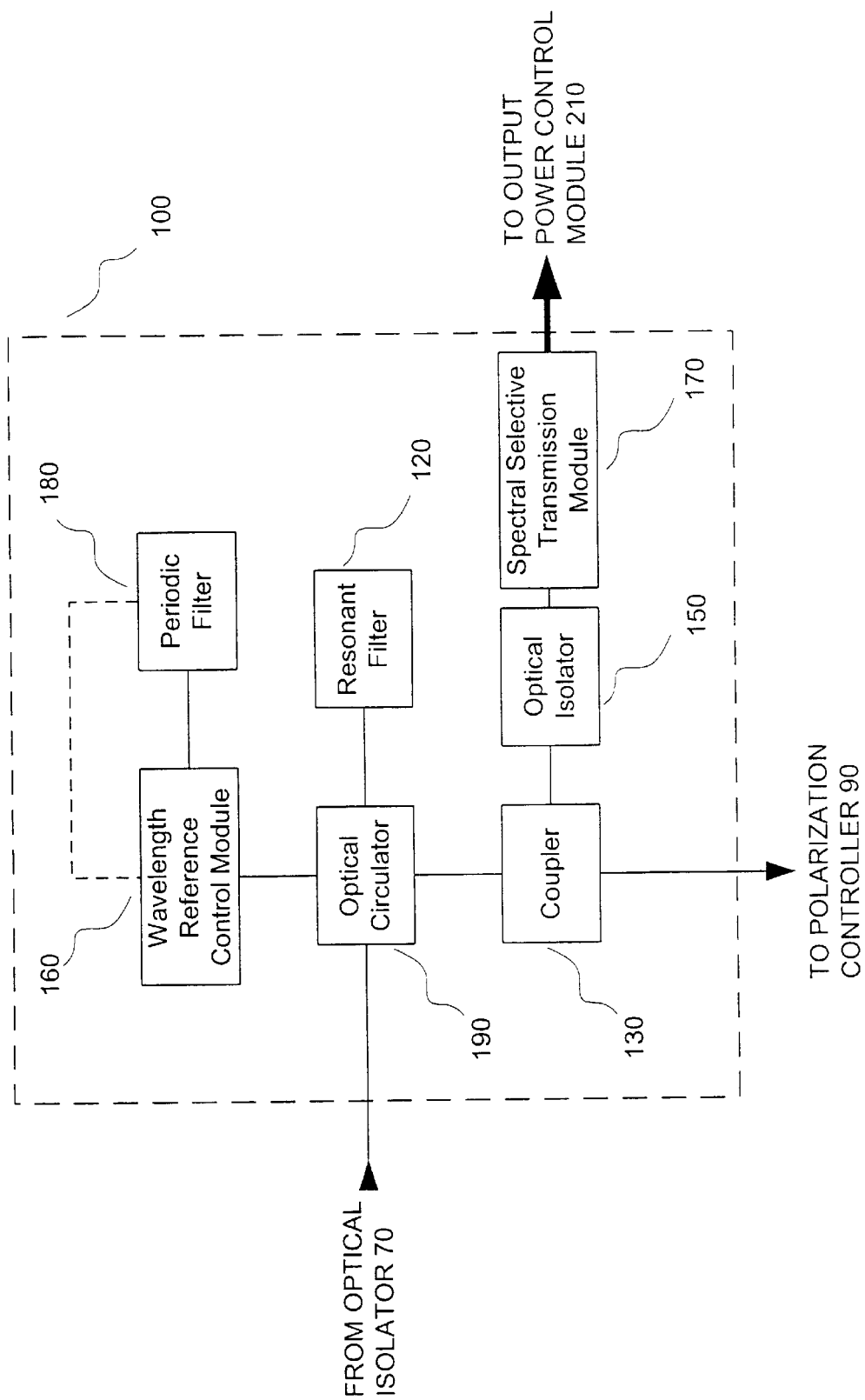
FIG. 4 is a functional block diagram of a second presently preferred embodiment of a laser spectral control module according to the present invention.

The invention has been described above in terms of the use of a transmission periodic filter. It is also possible to use a reflection periodic filter. An arrangement using a reflective periodic filter is shown in FIG. 4. As shown there, the laser spectral control module 100 may include a reflective periodic filter 180 optically coupled to the resonant filter 120 and optically coupled to the output coupler 130 through a four port optical circulator 190. In FIG. 4, elements numbered the same as those in FIG. 2 indicate elements with like functions.

The reflection periodic filter 180 is a filter which has high reflectivity for light with frequency within certain frequency bands, i.e., passbands, at approximately constant frequency spacing. In the preferred embodiment the reflection periodic filter 180 has, similarly to periodic filter 110, passbands spaced apart at a frequency spacing of 200 GHz or a sub-multiple of that spacing, such as 100 GHz, 50 GHz, 25 GHz, 12.5 GHz, or other. Also similarly to the periodic filter 110, the reflection periodic filter 180 limits the possible lasing wavelengths of the multi-wavelength ring laser 10 by introducing lower optical loss at the passbands as compared to other wavelengths, with the effect of precluding laser action at the low reflectivity bands of the periodic filter 180. In the preferred embodiment, the center wavelength of one, or more, of the passbands may be kept within certain values of a predetermined frequency so as to obtain a laser output with a wavelength or wavelengths according to International Telecommunications Union (ITU) frequency grid recommendations, or according to another set of wavelengths. For certain applications the reflection periodic filter 180 may be tunable by electrical or mechanical means.

Figure 5:
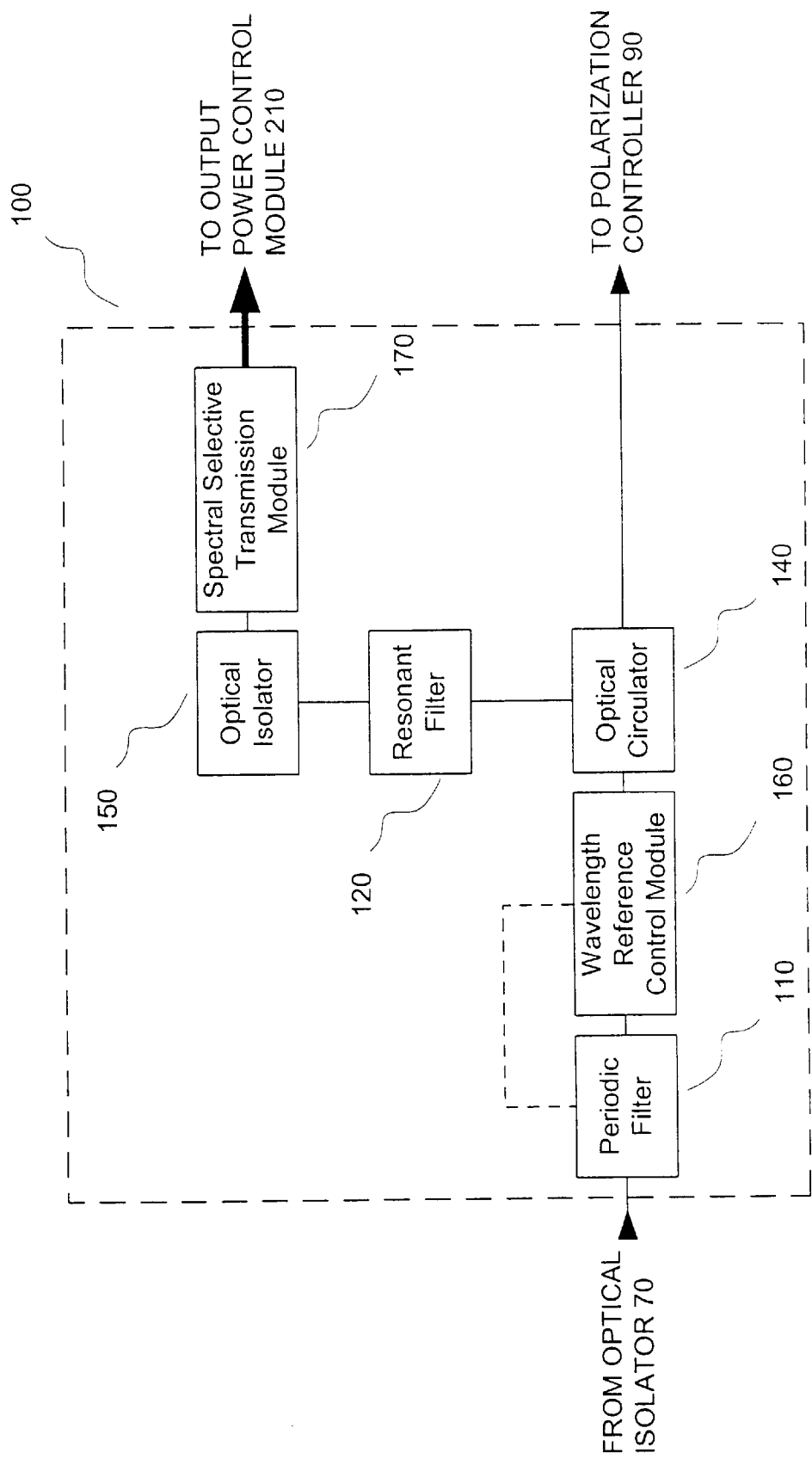
FIG. 5 is a functional block diagram of a third presently preferred embodiment of a laser spectral control module according to the present invention.
Figure 6:
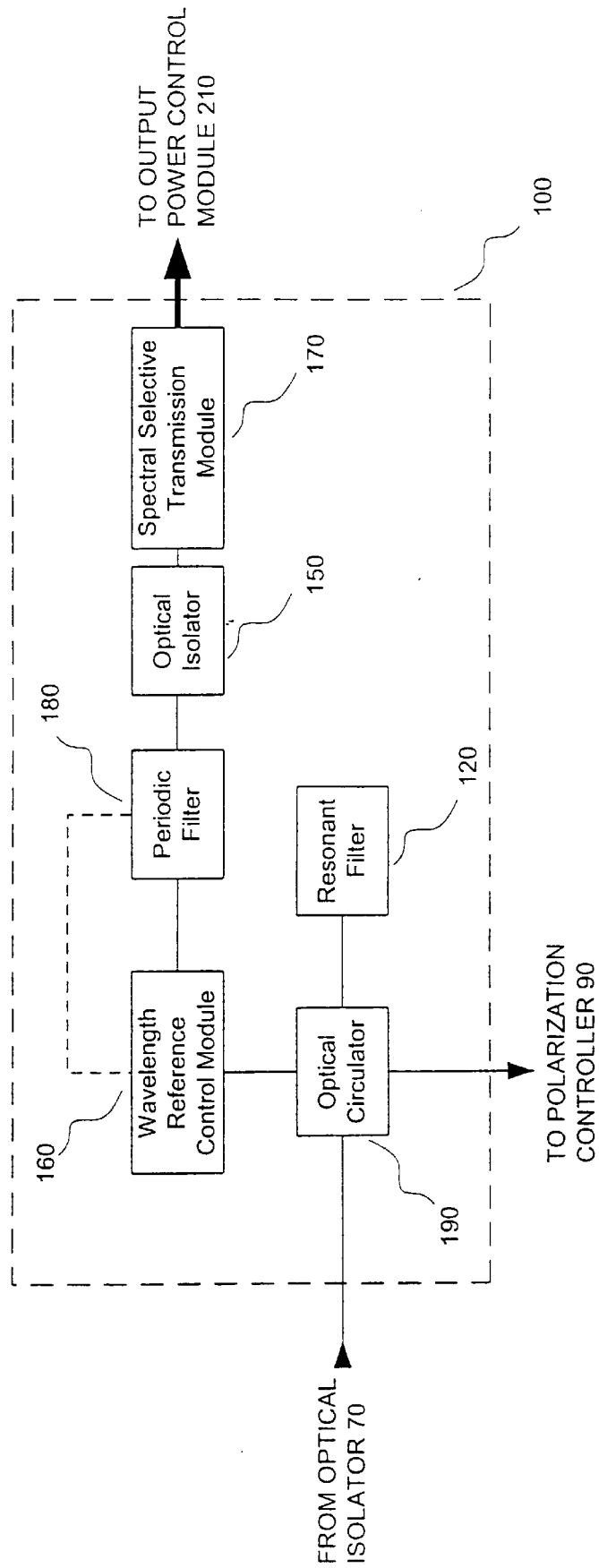
FIG. 6 is a functional block diagram of a fourth presently preferred embodiment of a laser spectral control module according to the present invention.
Figure 7:
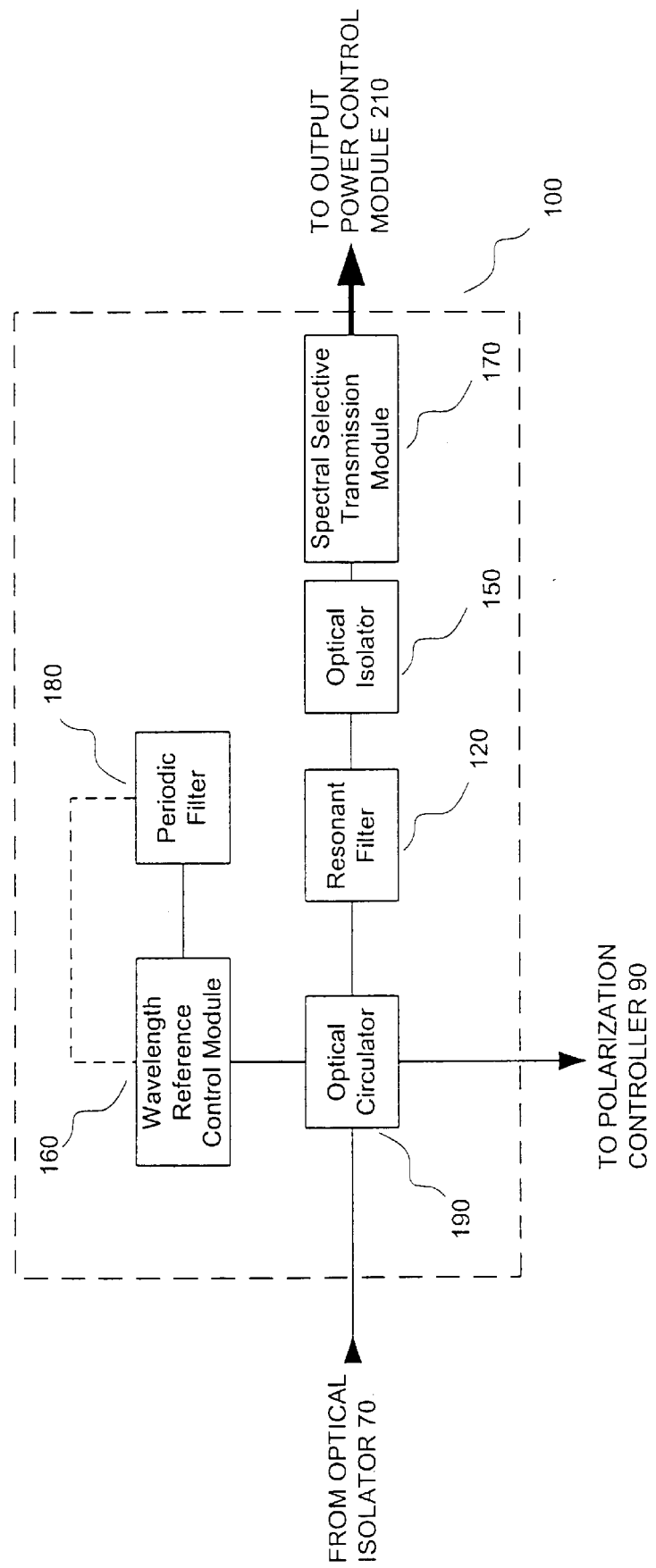
FIG. 7 is a functional block diagram of a fifth presently preferred embodiment of a laser spectral control module according to the present invention.

In other embodiments of the invention, either the reflection periodic filter 180 or the resonant filter 120 may partially transmit laser radiation thus providing means for obtaining a useful output from the fiber laser 10, thus rendering optional the use of a separate output power coupler such as output coupler 130. FIGS. 5, 6, and 7 illustrate arrangements for the laser spectral control module 100 where the output of laser 10 is obtained through the reflection periodic filter 180 or the resonant filter 120. In these Figures, elements numbered the same as those in FIGS. 2 and 4 indicate elements with like functions. As mentioned, the thicker solid lines represent one or more optical fibers.

In the arrangement of FIG. 5, for example, a resonant filter 120 that partially transmits optical radiation permits some of the optical energy to pass through the resonant filter 120 as an output signal with the rest of the optical energy being coupled back into the resonator. Similarly, in the arrangement of FIG. 6, a periodic filter 180 that partially transmits optical radiation permits some of the optical energy to pass as an output signal while reflecting the rest of the optical energy back into the optical circulator 190 and so to be coupled back into the resonator. FIG. 7 shows an arrangement with a reflection periodic filter 180 used in conjunction with a resonant filter 120 that partially transmits optical radiation. Again, the resonant filter 120 that partially transmits optical radiation permits some of the optical energy to pass as an output signal while reflecting the rest of the optical energy back into the optical circulator 190 and so to be coupled back into the resonator by coupler 130.

Figure 8:
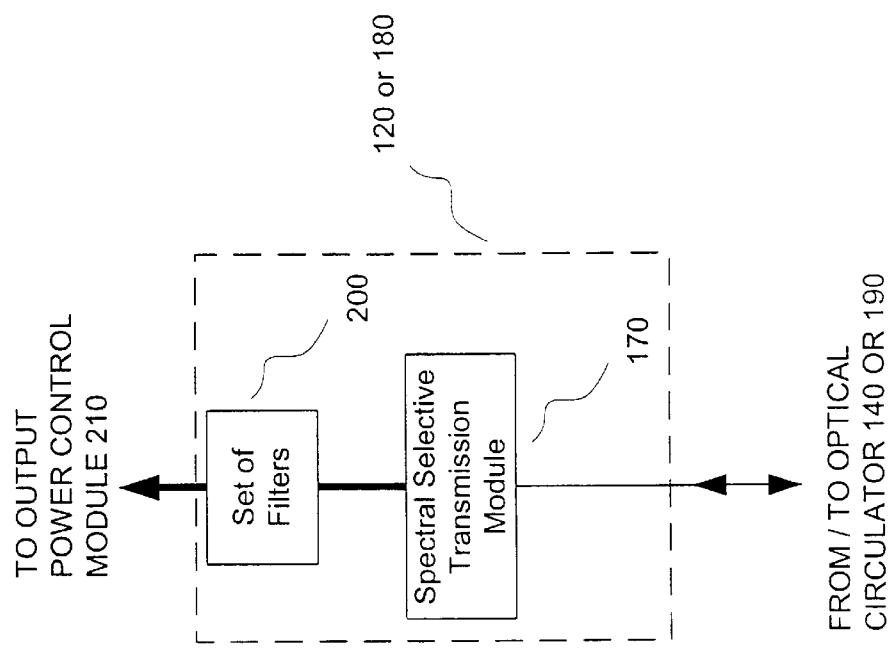
FIG. 8 is a functional block diagram of a presently preferred embodiment of a resonant filter or a periodic filter with means to access the individual oscillation wavelengths of the laser through separated output optical fibers, according to the present invention.

In another embodiment of the invention, the resonant filter 120 or the reflection periodic filter 180 may also provide means to access one or more individual oscillation wavelengths of laser 10 through separated output optical fibers. In a preferred embodiment of the invention, this is achieved with an arrangement of a spectral selective transmission module 170 and a set of filters 200, as depicted in FIG. 8. As an illustrative example, the spectral selective transmission module 170 may be a set of fiber-fused Mach-Zehnder interleavers and the set of filters 200 may be a set of fiber Bragg gratings. However, accessing the individual oscillation wavelength of the laser 10 through the resonant filter 120 or the reflection periodic filter 180 is not limited to the use of these components and may be achieved by any of other various means and methods known in the art.

In another embodiment of the invention, the transmissivity/reflectivity curve of the periodic filter 110 or 180, and/or of the resonant filter 120 or filters 200 may have a wavelength dependency which compensates the wavelength-dependent gain curve of the gain module 20, in the sense described earlier for the gain-flattening filter 60. This may be implemented by adjusting the reflectivity or transmissivity passbands of each individual filter to compensate for the wavelength-dependent gain curve of the gain module 20, thus rendering optional the use of a gain-flattening filter such as the gain-flattening filter 60.

Figure 9:
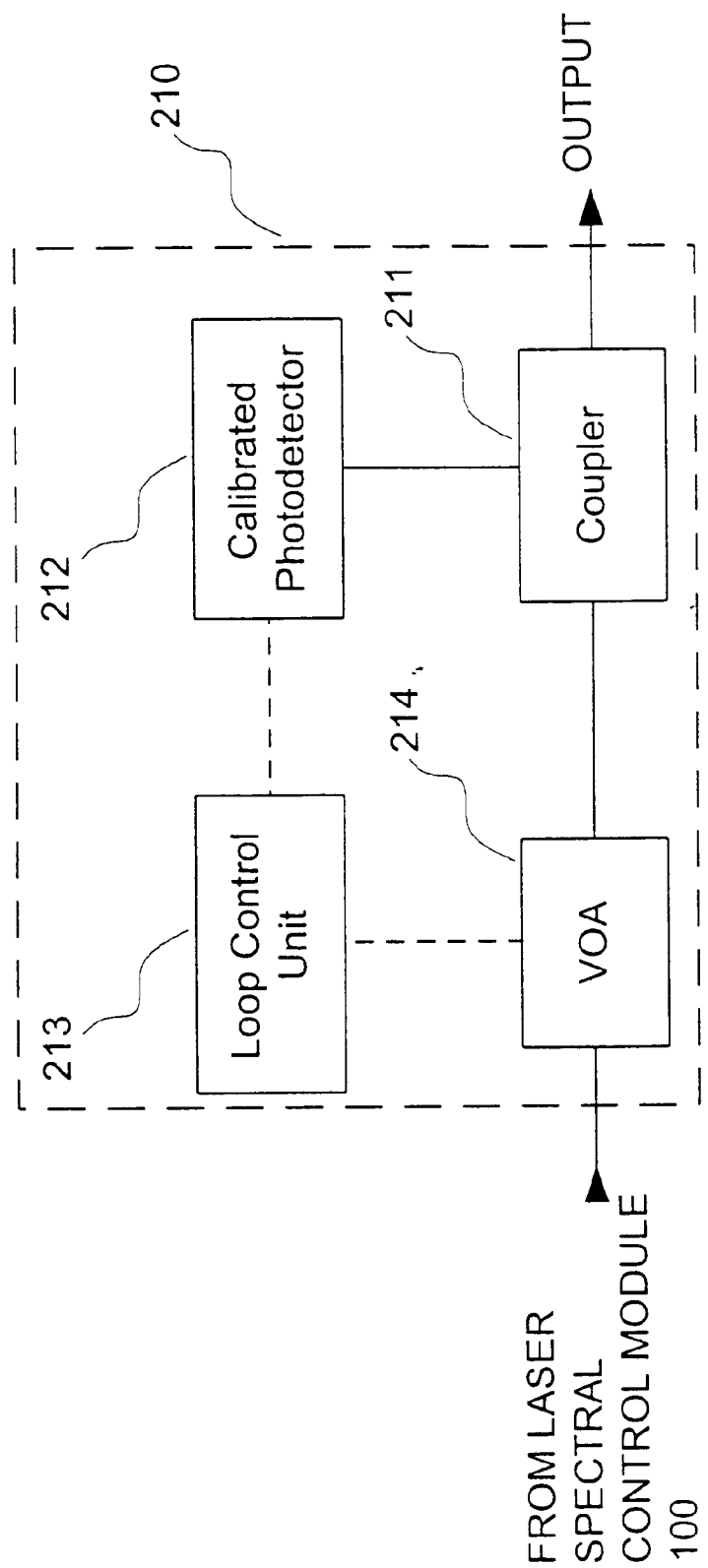
FIG. 9 is a functional block diagram of a presently preferred embodiment of a laser output power control module according to the present invention.

In another embodiment of the invention, a laser output power control module 210 can be inserted in-line with the output of the laser 10, as depicted in FIG. 1, in order to set and maintain the optical output power of the fiber laser 10 according to a predetermined value. In the presently preferred embodiment of the invention, the laser output power control module 210 uses, as shown in FIG. 9, a coupler 211 to extract a fraction of the fiber laser 10 optical output power, which is optically coupled to a calibrated photodetector 212. As an illustrative example, the coupler 211 may be a 01/99 fiber-fused coupler. However, extracting a fraction of the output laser light radiation is not limited to this method and may be achieved by any of other methods known in the art. The loop control unit 213 uses the electric reference signal provided by the calibrated photodetector 212 to ensure closed-loop control of an in-line variable optical attenuator (VOA) 214. In the closed-loop mode of operation laser output power instabilities caused by fluctuations in laser 10 are reduced. The laser output power control module 210 may further render optional the use of a gain-flattening filter, such as gain-flattening filter 60, in order to provide wavelength independent laser output power as required in some applications. It will be readily apparent to one having ordinary skill in the art that when access to the individual oscillation wavelength of laser 10 through separated output optical fibers is provided, a laser output power control module 210 can be inserted in-line with each of the output optical fibers, in order to set and maintain the optical output power of each particular oscillation wavelength according to a predetermined value.

Figure 10A:
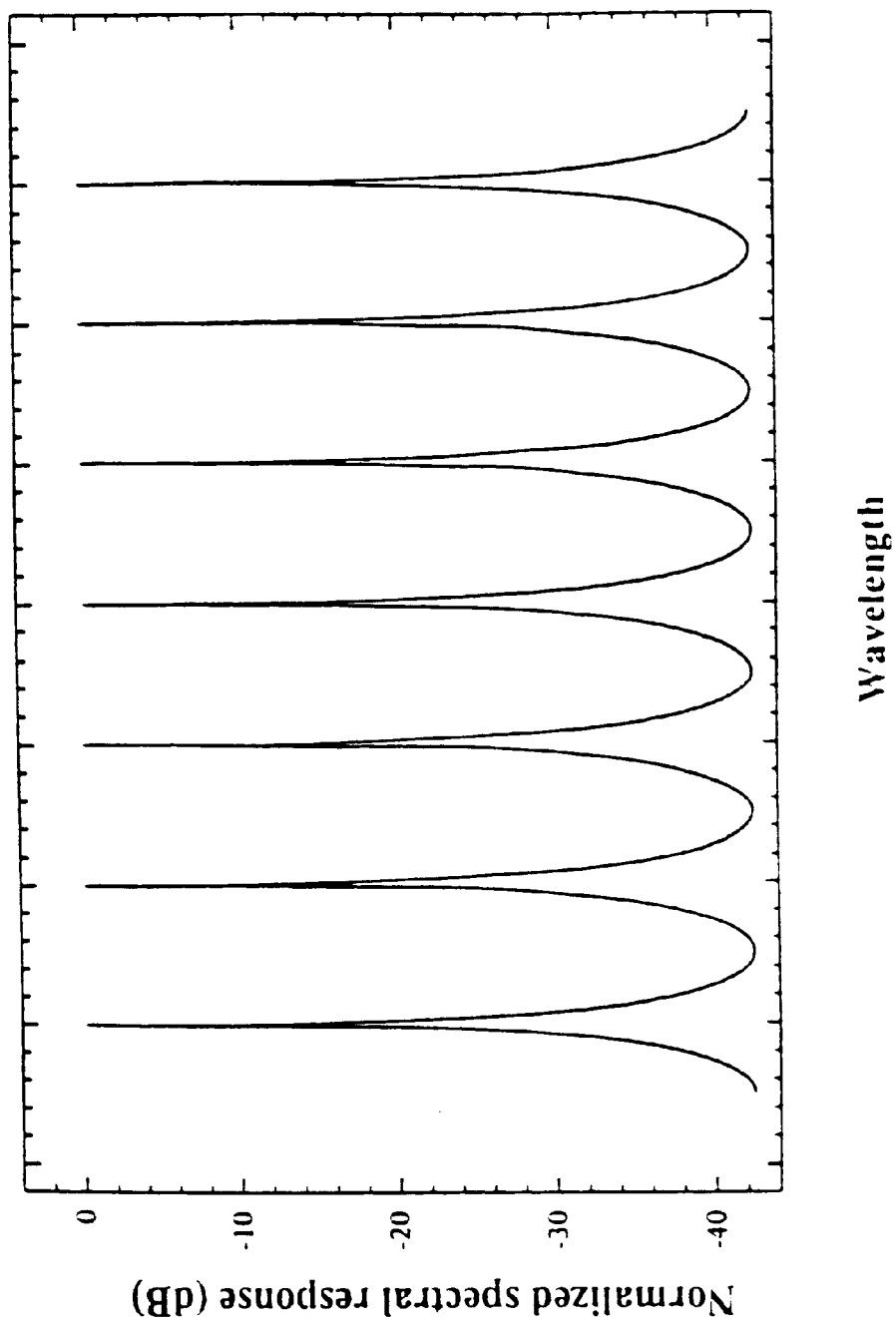
FIG. 10(a) is a graph qualitatively illustrating a spectral response of a periodic filter in a presently preferred embodiment of a system according to the present invention.
Figure 10B:
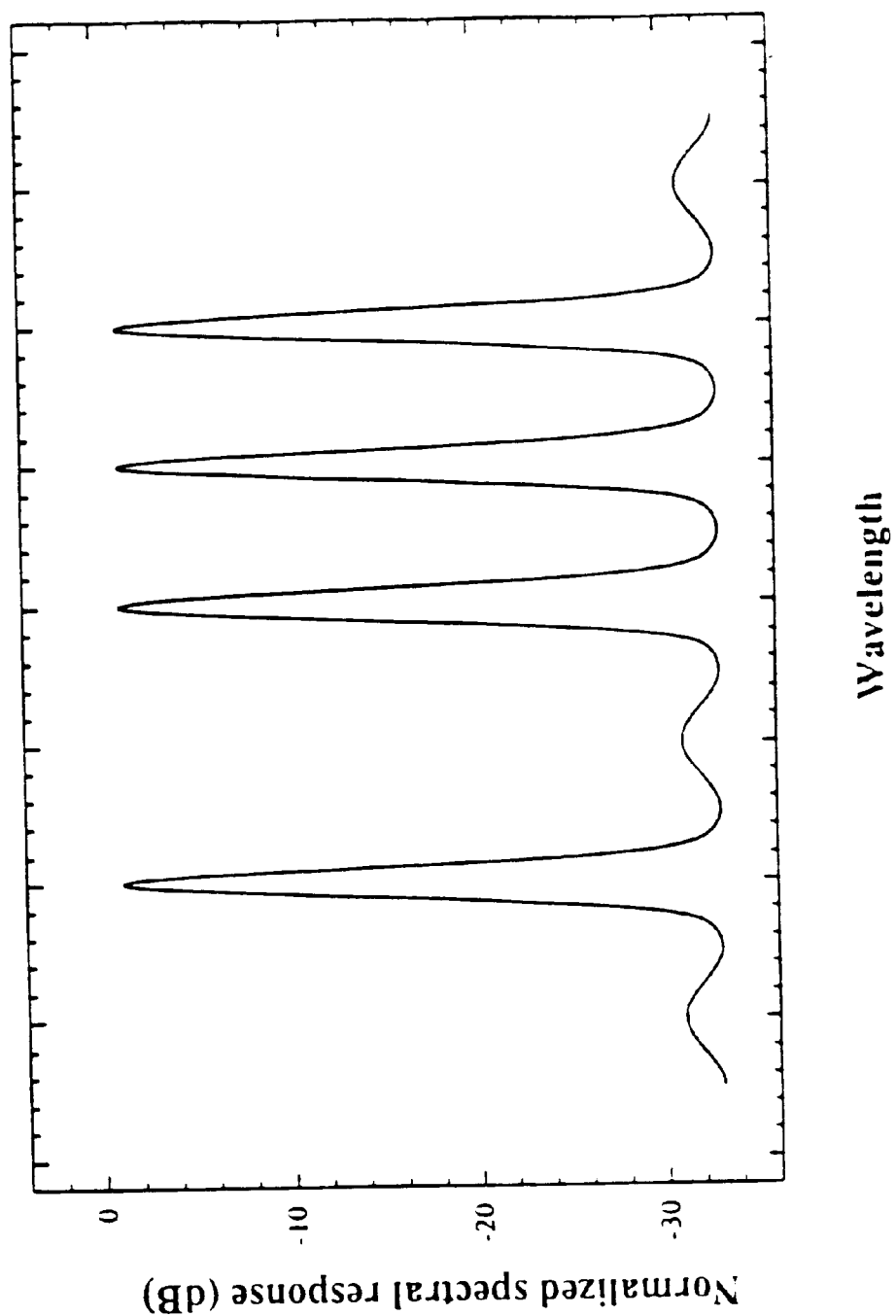
FIG. 10(b) is a graph of a spectral response of a resonant filter in a presently preferred embodiment of a system according to the present invention.
Figure 10C:
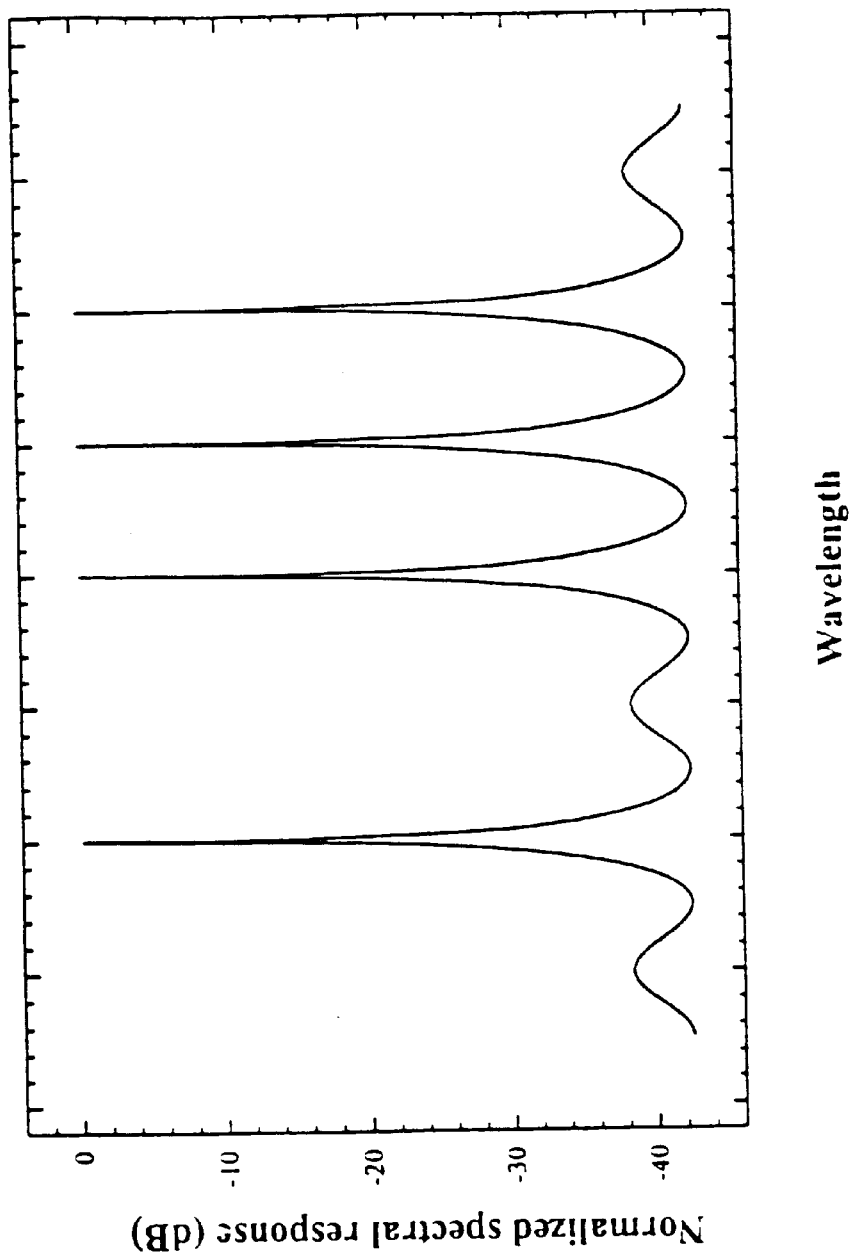
FIG. 10(c) is a graph of a combined spectral response of a periodic filter and a resonant filter, in a presently preferred embodiment of a system according to the present invention.

According to the present invention, the overlap of the passbands of the resonant filters 120 or 200 and the periodic filters 110 or 180 defines a set of passbands with laser transmissivity higher than any other frequency band within the frequency operating range of the fiber laser 10, therefore restricting the output wavelengths of the fiber laser 10 to within such high-transmissivity passbands. FIG. 10(*a*) shows an example of a calculated spectral transmissivity curve of such a transmission periodic filter 110 or spectral reflectivity curve of such a reflection periodic filter 180. FIG. 10(*b*) shows an example of a calculated spectral reflectivity curve of such a resonant filter 120. FIG. 10(*c*) shows an example of a calculated combined transmissivity curve of such resonant filters 120 and such periodic filters 110 or 180 illustrating the resulting high-transmissivity passbands. It will be readily apparent to one having ordinary skill in the art that the spectral response of the resonant filter 120 must be such that only a restricted number of high-transmissivity passbands exists and that the spacing between those high-transmissivity passbands may be arbitrarily defined within the frequency operating range of the fiber laser 10.

It will be readily apparent to one having ordinary skill in the art that the exact output wavelengths of the fiber laser 10 will be determined by the wavelength dependence of both the overall cavity loss and the gain in the gain module 20, and by mode-pulling effects and laser dynamics of various natures. It will also be readily apparent to one having ordinary skill in the art that within each of the passbands defined by the overlap of the passbands of the resonant filters 120 or 200 and the periodic filters 110 or 180 several cavity longitudinal modes may attain the laser threshold, resulting in laser emission composed of several nearly equally spaced wavelengths. For certain applications, the cavity of the laser 10 may be designed to ensure single longitudinal mode operation within each such passband, increasing side-mode suppression and reducing the emission line-width and noise. In the presented preferred embodiment of the invention, depicted in FIG. 1, the total length of the laser resonator 10 is defined such that its longitudinal spectral mode structure in combination with the spectral characteristics of the intracavity filters restricts the laser emission to only one well-defined cavity longitudinal mode within each one of the laser resonant passbands. It will be readily apparent to one having ordinary skill in the art that unidirectional laser oscillation can further assist single longitudinal mode operation within each one of the laser resonant passbands.

In the preferred embodiments of the ring laser 10 cavity described above, the periodic filter 110 is preferably a fiber or fiber-coupled Fabry-Pérot micro-etalon transmission filter and the reflection periodic filter 180 is preferably a sampled or set of sampled fiber Bragg gratings reflection filters. It will be readily apparent to one having ordinary skill in the art, however, that the specific choice of components for implementing the functions of the periodic filters 110 and 180 is not limited to such components but instead may be transmission or reflection filters made by any other means known in the art, such as: discrete set of fiber Bragg gratings, long-period fiber gratings, fiber interferometers, fiber wavelength-dependent couplers, fiber or fiber-coupled Fabry-Pérot etalon filters, integrated-optic devices, quantum-well structures, and semiconductor waveguides.

In the preferred embodiments described above, the resonant filter 120 and filters 200 are preferably a set of fiber Bragg gratings or a set of sampled fiber Bragg gratings. It will be readily apparent to one having ordinary skill in the art, however, that the specific choice of a component for implementing the functions of the resonant filters 120 and filters 200 is not limited to such components but instead may be a reflection filter made by any other means known in the art, such as: fiber or fiber-coupled Fabry-Pérot filter, long-period fiber gratings, fiber interferometers, fiber wavelength-dependent couplers, angle dielectric filter stacks, acousto-optic filters, quantum-well structures, semiconductor waveguides, and integrated optic devices. In other embodiments of this invention the ring laser 10 may include at least one optical switch in conjunction with sets of any of the periodic and/or resonant filters referred above allowing for configurable laser operation.

In the presently preferred embodiment, components in the laser 10 resonator are preferably optically coupled using lengths of single-mode fiber. For certain applications, the laser 10 resonator may comprise fiber lengths, in part or in total, made of polarization maintaining single-mode fiber. Also, for certain applications, the laser 10 resonator may also or alternatively include lengths of non-single-mode fiber.

As mentioned, the cavity elements in the laser 10 resonator may be placed within the cavity accordingly to different positions other than those shown in the diagrams, which are to be regarded as illustrative examples of such arrangements. Also as mentioned, it will be readily apparent to one having ordinary skill in the art that the present invention may also be implemented in a linear laser resonator configuration.

The invention has been described herein using specific embodiments for the purposes of illustration only. It will be readily apparent to one of ordinary skill in the art, however, that the principles of the invention can be embodied in other ways. Therefore, the invention should not be regarded as being limited to the specific embodiments disclosed herein, but instead as being fully commensurate in scope with the following claims.

What is claimed is:

1. A laser apparatus comprising:
   a gain module which is pumped by applied pump radiation, said pump radiation exciting said gain module thereby achieving lasing action; and
   a control module, said control module including
      a transmission periodic filter arranged to receive optical energy from said gain module and having relatively higher transmissivity in certain frequency bandwidths to define a first set of frequency passbands; and
      a resonant filter arranged to receive optical energy from said periodic filter and defining a second set of frequency passbands, said second set of frequency passbands being a subset of said first set of frequency passbands.

2. A laser apparatus as claimed in claim 1 wherein said laser apparatus is configured as a ring laser resonator.

3. A laser apparatus as claimed in claim 1 wherein said control module further comprises an optical circulator and wherein said transmission periodic filter and said resonant filter are coupled using said optical circulator.

4. A laser apparatus as claimed in claim 1 wherein said first set of frequency passbands corresponds to International Telecommunication Union frequency grid recommendations.

5. A laser apparatus as claimed in claim 1 wherein said transmission periodic filter comprises one of a fiber Fabry- Pérot micro-etalon transmission filter and a fiber-coupled Fabry-Pérot micro-etalon transmission filter.

6. A laser apparatus as claimed in claim 1 wherein said transmission periodic filter is tunable.

7. A laser apparatus as claimed in claim 1 further comprising means for ensuring unidirectional laser oscillation.

8. A laser apparatus as claimed in claim 1 also comprising an optical gain-flattening filter for obtaining an approximately constant laser output power for specified wavelengths of operation of the laser resonator.

9. A laser apparatus as claimed in claim 8 wherein said optical gain-flattening filter has a wavelength-dependent loss curve which compensates the wavelength-dependent gain curve of said gain module.

10. A laser apparatus as claimed in claim 8 wherein said optical gain-flattening filter comprises a set of long-period fiber gratings.

11. A laser apparatus as claimed in claim 8 wherein said optical gain-flattening filter is incorporated into said gain module.

12. A laser apparatus as claimed in claim 1 further comprising at least one optical isolator to ensure unidirectional laser oscillation.

13. A laser apparatus as claimed in claim 1 further comprising at least one polarization controller.

14. A laser apparatus as claimed in claim 1 wherein said transmission periodic filter has passbands spaced apart at a frequency spacing of 200 GHz.

15. A laser apparatus as claimed in claim 1 wherein said transmission periodic filter has passbands spaced apart at a sub-multiple of 200 GHz.

16. A laser apparatus as claimed in claim 1 wherein a center wavelength of at least one member of said first set of frequency passbands is maintained sufficiently close to a predetermined frequency so as to obtain a laser output with a wavelength according to International Telecommunication Union frequency grid recommendations.

17. A laser apparatus as claimed in claim 1 wherein said resonant filter has a subset of frequency passbands selected from the set of frequency passbands defined by the transmission periodic filter.

18. A laser apparatus as claimed in claim 17 wherein said resonant filter passband bandwidths are sufficiently narrow that within each such passband laser oscillation occurs only for wavelengths within the first set of passbands of said transmission periodic filter.

19. A laser apparatus as claimed in claim 17 wherein said resonant filter passbands enclose more than one of the members of the first set of passbands of said transmission periodic filter to ensure multi-wavelength oscillation in adjacent passbands of said transmission periodic filter.

20. A laser apparatus as claimed in claim 1 wherein said control module also includes an optical isolator.

21. A laser apparatus as claimed in claim 1 wherein said control module also includes a wavelength reference control module for locking a spectral response of said transmission periodic filter to said first set of passbands.

22. A laser apparatus as claimed in claim 21 wherein said wavelength reference control module includes a coupler, optically coupled to the other elements in the resonator, for extracting a small fraction of laser radiation from said laser cavity, a photodetector, and a wavelength reference filter for coupling a narrow-band optical signal from the coupler to the photodetector to provide a stable wavelength reference.

23. A laser apparatus as claimed in claim 22 wherein said wavelength reference filter is a reflective wavelength reference filter.

24. A laser apparatus as claimed in claim 22 wherein said wavelength reference filter comprises a temperature-compensated fiber Bragg grating.

25. A laser apparatus as claimed in claim 1 wherein said control module further comprises a spectral selective transmission module.

26. A laser apparatus as claimed in claim 25 wherein said spectral selective transmission module comprises a set of fiber-fused Mach-Zehnder interleavers.

27. A laser apparatus as claimed in claim 1 wherein said resonant filter is partially reflective.

28. Laser apparatus as claimed in claim 1 wherein said resonant filter includes means for accessing individual oscillation wavelengths of said laser apparatus.

29. A laser apparatus as claimed in claim 28 wherein said means for accessing individual oscillation wavelengths of laser comprises separated output optical fibers.

30. A laser apparatus as claimed in claim 29 wherein a laser output power control module is inserted in-line with each of the output optical fibers.

31. A laser apparatus as claimed in claim 28 wherein said means for accessing individual oscillation wavelengths of laser comprises a spectral selective transmission module and a set of filters.

32. A laser apparatus as claimed in claim 30 wherein said spectral selective transmission module comprises a set of fiber-fused Mach-Zehnder interleavers and wherein said set of filters comprises a set of fiber Bragg gratings.

33. A laser-apparatus as claimed in claim 1 wherein at least one of said transmission periodic filter and said resonant filter has a wavelength-dependent envelope curve which compensates a wavelength-dependent gain curve of the gain module.

34. A laser apparatus as claimed in claim 1 further comprising a laser output power control module, inserted in-line with an output of said laser apparatus, for setting and maintaining a predetermined level for optical output power of said laser apparatus.

35. A laser apparatus as claimed in claim 34 wherein said laser output power control module comprises:
  a coupler to extract a fraction of laser optical output power;
  a calibrated photodetector optically coupled to said coupler and producing an electric reference signal;
  a loop control unit, arranged to receive said electric reference signal, for generating a control signal based on said electric reference signal; and
  an in-line variable optical attenuator arranged to receive said control signal, for controlling said laser optical output power based on said control signal.

36. A ring laser resonator capable of simultaneously producing a plurality of wavelengths each corresponding respectively to one of the wavelengths corresponding to the International Telecommunication Union frequency grid recommendations for wavelength division multiplexing, said ring laser resonator comprising:
  a gain module which is pumped by applied pump radiation, said pump radiation exciting said gain module thereby achieving lasing action;
  a control module including:
    a periodic filter arranged to receive optical energy from said gain module and
    having relatively higher transmissivity in certain predefined frequency bandwidths to define a first set of frequency passbands corresponding to the International Telecommunication Union frequency grid recommendations for wavelength division multiplexing;

a wavelength reference control module for locking a spectral response of said periodic filter to said set of frequency passbands corresponding to the International Telecommunication Union frequency grid; and a resonant filter arranged to receive optical energy from said periodic filter and defining a second set of frequency passbands, said second set of frequency passbands being a subset of said first set of frequency passbands; and a laser output power control module, inserted in-line with an output of said ring laser resonator, for setting and maintaining a predetermined level for optical output power of the ring laser resonator.

37. A method of generating a laser output at any and more than one of a set of discrete frequencies, said method comprising the steps of:

providing pump energy to a gain medium in a laser cavity to excite a laser resonance;

filtering the laser resonance using a periodic filter to limit possible lasing frequencies to said frequencies in said set; and filtering the laser resonance using a resonant filter to limit possible lasing frequencies to a subset of said frequencies in said set.

38. A laser apparatus comprising:

a gain module which is pumped by applied pump radiation, said pump radiation exciting said gain module thereby achieving lasing action;

a periodic filter arranged to receive optical energy from said gain module and having relatively higher transmissivity in certain predefined frequency bandwidths to define a first set of frequency passbands; and a resonate filter to receive optical energy from said periodic filter and defining a second set of frequency passbands, said second set of frequency passbands being a subset of said first set of frequency passbands.

39. Laser apparatus comprising:

a gain module which is pumped by applied pump radiation, said pump radiation exciting said gain module thereby achieving lasing action; and a control module, said control module including a reflection periodic filter arranged to receive optical energy from said gain module and having relatively higher transmissivity in certain frequency bandwidths to define a first set of frequency passbands, wherein said reflection filter comprises a sampled fiber Bragg grating; and a resonant filter arranged to receive optical energy from said periodic filter and defining a second set of frequency passbands, said second set of frequency passbands being a subset of said first set of frequency passbands.

40. Laser apparatus as claimed in claim 39 wherein said laser apparatus is configured as a ring laser resonator.

41. Laser apparatus as claimed in claim 39 wherein said control module further comprises an optical circulator and wherein said reflection periodic filter and said resonant filter are coupled using said optical circulator.

42. Laser apparatus as claimed in claim 39 wherein said first set of frequency passbands corresponds to International Telecommunication Union frequency grid recommendations.

43. Laser apparatus as claimed in claim 39 wherein said reflection periodic filter has characteristics defined according to the International Telecommunication Union frequency grid recommendations for wavelength division multiplexing.

44. Laser apparatus as claimed in claim 39 wherein said reflection periodic filter is tunable.

45. Laser apparatus as claimed in claim 39 further comprising means for ensuring unidirectional laser oscillation.

46. Laser apparatus as claimed in claim 39 also comprising an optical gain- flattening filter for obtaining an approximately constant laser output power for specified wavelengths of operation of the laser resonator.

47. Laser apparatus as claimed in claim 46 wherein said optical gain-flattening filter has a wavelength-dependent loss curve which compensates the wavelength-dependent gain curve of said gain module.

48. Laser apparatus as claimed in claim 46 wherein said optical gain-flattening filter comprises a set of long-period fiber gratings.

49. Laser apparatus as claimed in claim 46 wherein said optical gain-flattening filter is incorporated into said gain module.

50. Laser apparatus as claimed in claim 39 further comprising at least one optical isolator to ensure unidirectional laser oscillation.

51. Laser apparatus as claimed in claim 39 further comprising at least one polarization controller.

52. Laser apparatus as claimed in claim 39 wherein said reflection periodic filter has passbands spaced apart at a frequency spacing of 200 GHz.

53. Laser apparatus as claimed in claim 39 wherein said reflection periodic filter has passbands spaced apart at a sub-multiple of 200 GHz.

54. Laser apparatus as claimed in claim 39 wherein a center wavelength of at least one member of said first set of frequency passbands is maintained sufficiently close to a predetermined frequency so as to obtain a laser output with a wavelength according to International Telecommunication Union frequency grid recommendations.

55. Laser apparatus as claimed in claim 39 wherein said resonant filter has a subset of frequency passbands selected from the set of frequency passbands defined by the reflection periodic filter.

56. Laser apparatus as claimed in claim 55 wherein said resonant filter passband bandwidths are sufficiently narrow that within each such passband laser oscillation occurs only for wavelengths within the first set of passbands of said reflection periodic filter.

57. Laser apparatus as claimed in claim 55 wherein said resonant filter passbands enclose more than one of the members of the first set of passbands of said reflection periodic filter to ensure multi-wavelength oscillation in adjacent passbands of said reflection periodic filter.

58. Laser apparatus as claimed in claim 39 wherein said control module also includes an optical isolator.

59. Laser apparatus as claimed in claim 39 wherein said control module also includes a wavelength reference control module for locking a spectral response of said reflection periodic filter to said first set of passbands.

60. Laser apparatus as claimed in claim 59 wherein said wavelength reference control module includes a coupler, optically coupled to the other elements in the resonator, for extracting a small fraction of laser radiation from said laser cavity, a photodetector, and a wavelength reference filter for coupling a narrow-band optical signal from the coupler to the photodetector to provide a stable wavelength reference.

61. Laser apparatus as claimed in claim 60 wherein said wavelength reference filter is a reflective wavelength reference filter.

62. Laser apparatus as claimed in claim 60 wherein said wavelength reference filter comprises a temperature-compensated fiber Bragg grating.

63. Laser apparatus as claimed in claim 39 wherein said control module further comprises a spectral selective transmission module.

64. Laser apparatus as claimed in claim 63 wherein said spectral selective transmission module comprises a set of fiber-fused Mach-Zehnder interleavers.

65. Laser apparatus as claimed in claim 39 wherein at least one of said reflective periodic filter and said resonant filter is only partially reflective.

66. Laser apparatus as claimed in claim 39 wherein at least one of said resonant filter and said reflective periodic filter includes means for accessing individual oscillation wavelengths of said laser apparatus.

67. Laser apparatus as claimed in claim 66 wherein said means for accessing individual oscillation wavelengths of laser comprises separated output optical fibers.

68. Laser apparatus as claimed in claim 67 wherein a laser output power control module is inserted in-line with each of the output optical fibers.

69. Laser apparatus as claimed in claim 66 wherein said means for accessing individual oscillation wavelengths of laser comprises a spectral selective transmission module and a set of filters.

70. Laser apparatus as claimed in claim 69 wherein said spectral selective transmission module comprises a set of fiber-fused Mach-Zehnder interleavers and wherein said set of filters comprises a set of fiber Bragg gratings.

71. Laser apparatus as claimed in claim 39 wherein at least one of said reflection periodic filter and said resonant filter has a wavelength-dependent envelope curve which compensates a wavelength-dependent gain curve of the gain module.

72. Laser apparatus as claimed in claim 39 further comprising a laser output power control module, inserted in-line with an output of said laser apparatus, for setting and maintaining a predetermined level for optical output power of said laser apparatus.

73. Laser apparatus as claimed in claim 72 wherein said laser output power control module comprises:

a coupler to extract a fraction of laser optical output power;

a calibrated photodetector optically coupled to said coupler and producing an electric reference signal;

a loop control unit, arranged to receive said electric reference signal, for generating a control signal based on said electric reference signal; and an in-line variable optical attenuator arranged to receive said control signal, for controlling said laser optical output power based on said control signal.

74. Laser apparatus as claimed in claim 39 wherein said reflection periodic filter comprises a set of sampled fiber Bragg gratings.

* * * * *